(12) United States Patent
Irie

(10) Patent No.: US 6,664,709 B2
(45) Date of Patent: Dec. 16, 2003

(54) SURFACE ACOUSTIC WAVE DEVICE

(75) Inventor: Yuji Irie, Omihachiman (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/917,993

(22) Filed: Jul. 30, 2001

(65) Prior Publication Data

US 2002/0043892 A1 Apr. 18, 2002

(30) Foreign Application Priority Data

Aug. 9, 2000 (JP) .................................. 2000-241674

(51) Int. Cl.⁷ .............................................. H01L 41/08
(52) U.S. Cl. ..................... 310/313 R; 310/348; 310/344
(58) Field of Search ........................... 310/313 R, 340, 310/344, 348

(56) References Cited

U.S. PATENT DOCUMENTS

| | | | | |
|---|---|---|---|---|
| 3,931,388 A | * | 1/1976 | Hafner et al. | 310/344 |
| 3,969,640 A | * | 7/1976 | Staudte | 310/344 |
| 4,354,133 A | * | 10/1982 | Vig | 310/344 |
| 5,162,822 A | * | 11/1992 | Wakamori | 333/193 |
| 5,281,883 A | * | 1/1994 | Ikata et al. | 310/313 R |
| 5,459,368 A | * | 10/1995 | Onishi et al. | 310/313 R |
| 5,699,027 A | * | 12/1997 | Tsuji et al. | 310/313 R |
| 5,889,357 A | * | 3/1999 | Yachi et al. | 310/344 |
| 5,939,817 A | * | 8/1999 | Takado | 310/348 |
| 6,037,698 A | * | 3/2000 | Ueda et al. | 310/313 R |
| 6,498,422 B1 | * | 12/2002 | Hori | 310/344 |

* cited by examiner

*Primary Examiner*—Mark Budd
(74) *Attorney, Agent, or Firm*—Keating & Bennett, LLP

(57) ABSTRACT

A metallized electrode is provided at a fixed location of the main body of a package such that the metallized electrode is located above signal electrodes and is not in contact with the signal electrodes and an insulating joining material. Also, the metallized electrode is made conductive to the grounding electrode.

20 Claims, 18 Drawing Sheets

SURFACE ACOUSTIC WAVE DEVICE

BACKGROUND OF THE INVENTION

1. Field of the Invention

The present invention relates to a surface acoustic wave device principally for use in a communication device or other electronic apparatus.

2. Description of the Related Art

Hereinafter, a conventional surface acoustic wave device including a surface acoustic wave element and a package is described.

The package includes a main body having an opening and a hollow space therein and a cover for closing the opening of the main body of the package. The main body of the package includes a substrate and at least one frame body provided on the periphery of the substrate. A grounding electrode and signal electrodes are provided on the substrate, and the surface acoustic wave element is fixed in the central portion of the substrate and the electrodes of the surface acoustic wave element are electrically connected to the grounding electrode and the signal electrodes via a metal wire.

The grounding electrode is arranged to connect the vicinity of the middle point of each of a pair of two sides of the substrate that face each other and is in contact with the bottom surface of the surface acoustic wave element. Furthermore, the grounding electrode is arranged so as to continuously cover the outside surface and bottom surface of the package. An unwanted electromagnetic wave generated by the surface acoustic wave element or other source, is absorbed by the grounding electrode. Furthermore, the signal electrodes are extended toward the surface acoustic wave element from the vicinity of the middle point of each of the other pair of two facing sides of the substrate, and the signal electrodes are arranged so as to continuously cover the outside surface and bottom surface of the substrate. The signal electrodes are also located a fixed distance away from the surface acoustic wave element in the vicinity of the surface acoustic wave element on the substrate so as not to contact the grounding electrode. These signal electrodes can input an external signal to the surface acoustic wave element and output a signal from the surface acoustic wave element to the outside.

In order to close the opening portion of the main body of the package, the cover is provided on the upper surface of the frame body. The cover and the frame body are joined by using an insulating joining material such as an insulating adhesive or fused glass, by heat. Then, in the bottom surface of the insulating joining material, that is, the whole area or a part of the upper surface of the frame body, a metallized electrode such as gold, is provided and is arranged to be conductive to the grounding electrode. As a result, an effect of absorbing an unwanted electromagnetic wave generated by the surface acoustic wave element and the signal electrodes can be obtained, and the inside of the package is electrically shielded.

However, the contact between the insulating adhesive or glass used as an insulating joining material and the gold used as a metallized electrode is bad, and as a result, a gap is caused therebetween. Also, there are cases in which the airtight condition of the package cannot be maintained, and also there is a possibility that the moisture penetrated into the gap adversely affects the surface acoustic wave element. When no metallized electrode is provided, the surface acoustic wave device cannot be fully electrically shielded and accordingly, there are cases in which the characteristics of the surface acoustic wave device are worsened.

SUMMARY OF THE INVENTION

In order to overcome the problems described above, preferred embodiments of the present invention provide a surface acoustic wave device that is constructed such that when a cover and a frame body are joined, a package including the cover and frame body is sufficiently shielded and the cover is joined to the package without causing any gap therebetween.

A surface acoustic wave device according to a first preferred embodiment of the present invention includes a surface acoustic wave element, and a package containing the surface acoustic wave element, the package including a main body having an opening and a hollow space therein, a cover provided on the upper surface of the main body of the package and arranged to close the opening of the main body of the package, signal electrodes arranged to transmit a signal input from outside of the package and a signal output from the surface acoustic wave element, and a grounding electrode arranged to ground an unwanted electromagnetic wave generated inside the package. The main body of the package and the cover are joined preferably by an insulating joining material, a metallized electrode which is located above the signal electrodes and is not in contact with the signal electrodes and the insulating joining material is provided at a fixed location of the main body of the package, and the metallized electrode is arranged to be conductive to the grounding electrode.

In the surface acoustic wave device according to a first preferred embodiment of the present invention, because no metallized electrode is provided on the surface that is joined by the insulating joining material, a sufficient joining strength can be obtained. Therefore, penetration of moisture into the package is reliably prevented. Furthermore, because the metallized electrode is provided at a fixed location of the main body of the package so as to be located above the signal electrodes and so as not to be in contact with the signal electrodes and the insulating joining material, and is conductive to the grounding electrode such that the grounding electrode absorbs and grounds an unwanted electromagnetic wave, the inside of the package is sufficiently shielded.

A surface acoustic wave device according to a second preferred embodiment of the present invention includes a surface acoustic wave element, and a package containing the surface acoustic wave element, the package including a main body having an opening and a hollow space therein, a cover provided on the upper surface of the main body of the package and arranged to close the opening portion of the main body of the package, signal electrodes arranged to transmit a signal input from outside of the package and a signal output from the surface acoustic wave element, and a grounding electrode for grounding an unwanted electromagnetic wave generated inside the package. The main body of the package and the cover are joined preferably by thermocompression bonding, a metallized electrode is located above the signal electrodes and is not in contact with the signal electrodes, the cover is provided at a fixed location of the main body of the package, and the metallized electrode is conductive to the grounding electrode.

It is preferable that the main body and cover are made of an insulating material.

In the surface acoustic wave device according to the second preferred embodiment of the present invention, even in the case of a surface acoustic wave device in which the cover and the main body of the package which are preferably made of an insulating material are joined by thermocompression bonding, the inside of the package is fully shielded in the same way as in the surface acoustic wave device according to a first preferred embodiment of the present invention.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Hereinafter, preferred embodiments of a surface acoustic wave device according to the present invention are described with reference to FIGS. 1A to 17B.

Figure 1A:
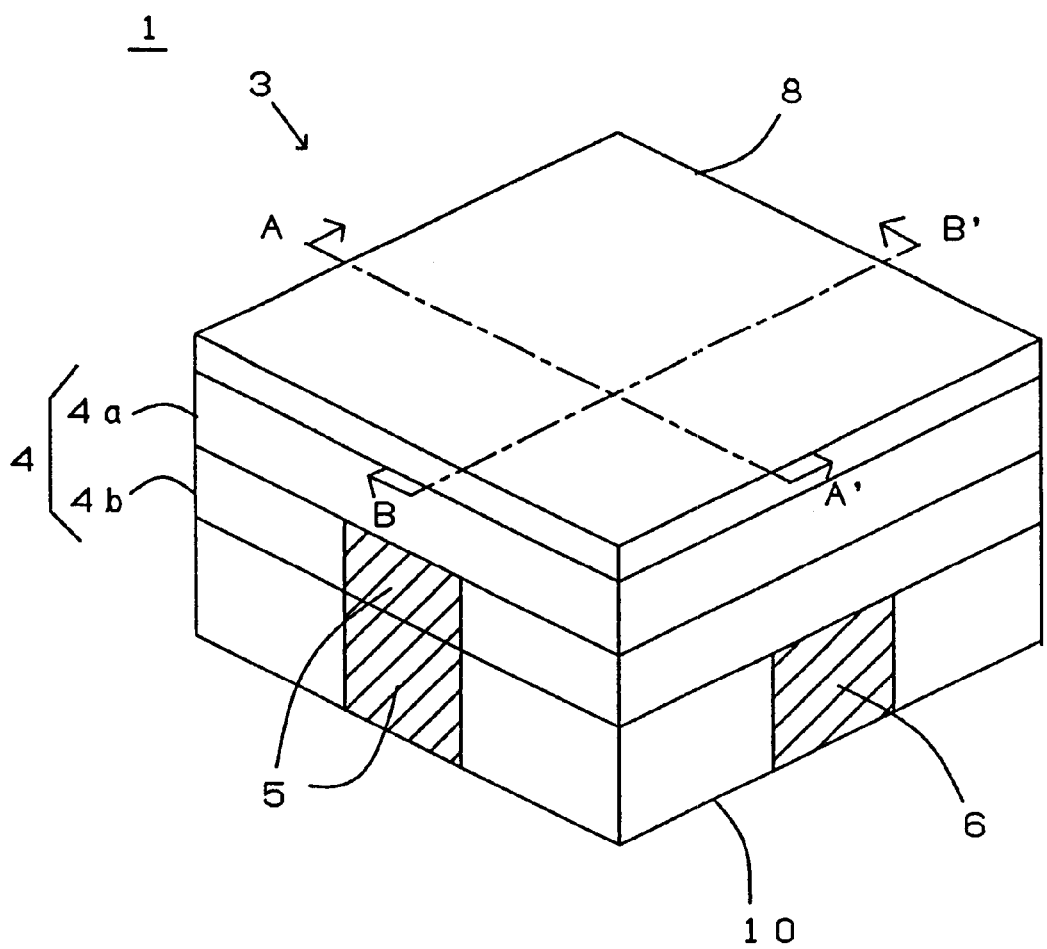
FIG. 1A is a perspective view showing a surface acoustic wave device according to a first preferred embodiment of the present invention.
Figure 1B:
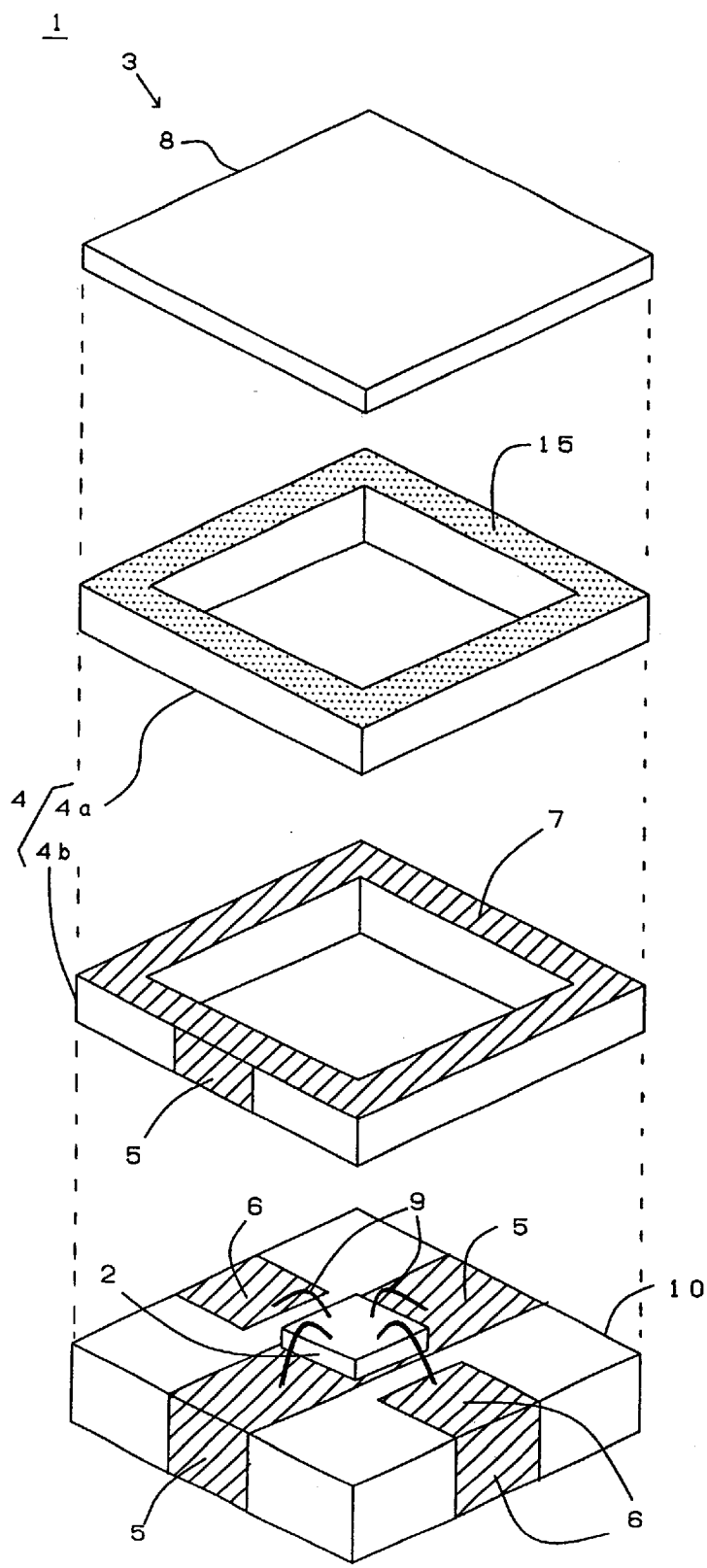
FIG. 1B is an exploded perspective view showing the surface acoustic wave device according to the first preferred embodiment of the present invention.
Figure 2A:
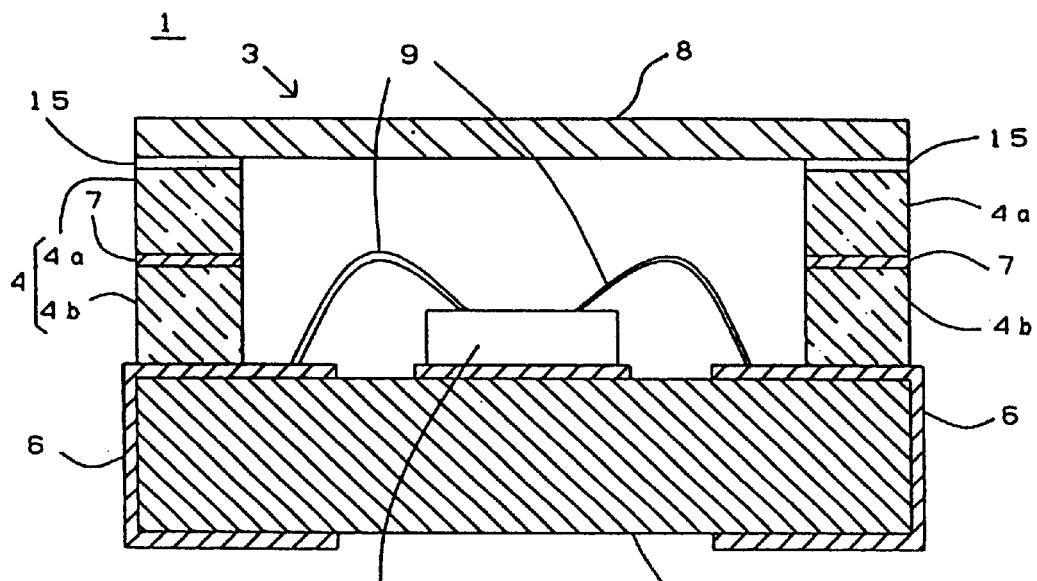
FIG. 2A is a longitudinal sectional view taken along line A–A' of FIG. 1A showing the surface acoustic wave device according to the first preferred embodiment of the present invention.
Figure 2B:
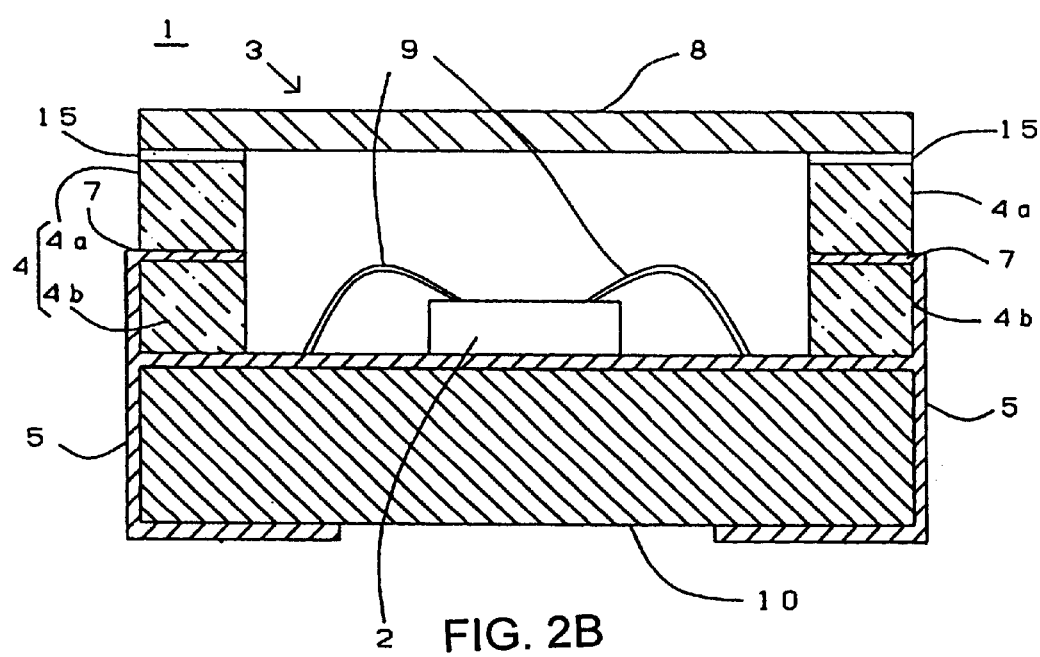
FIG. 2B is a longitudinal sectional view taken along line B–B' of FIG. 1A showing the surface acoustic wave device according to the first preferred embodiment of the present invention.
Figure 3A:
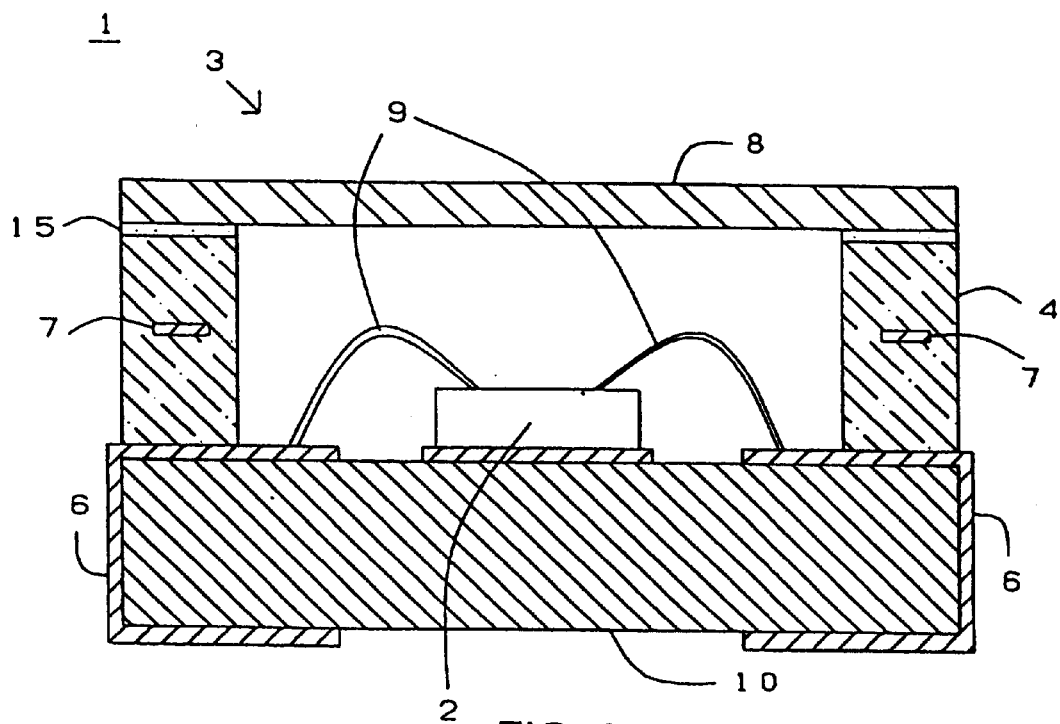
FIG. 3A is a longitudinal sectional view showing a modified preferred embodiment of the surface acoustic wave device according to the first preferred embodiment of the present invention.
Figure 3B:
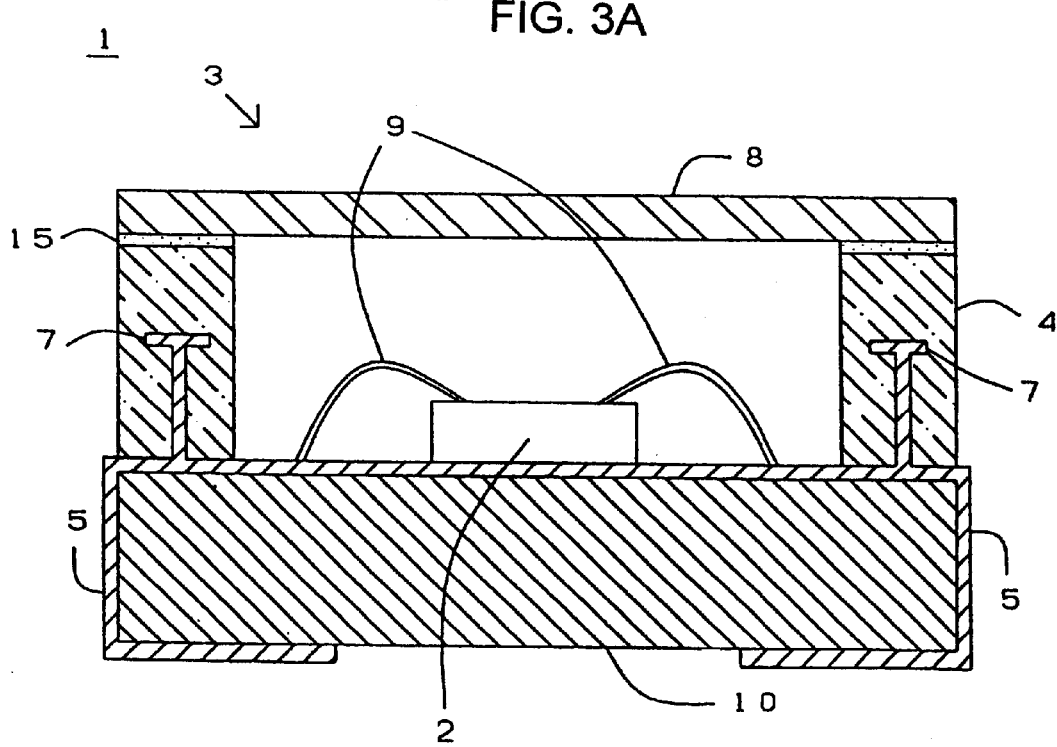
FIG. 3B is a longitudinal sectional view showing the modified preferred embodiment of the surface acoustic wave device according to the first preferred embodiment of the present invention.
Figure 4A:
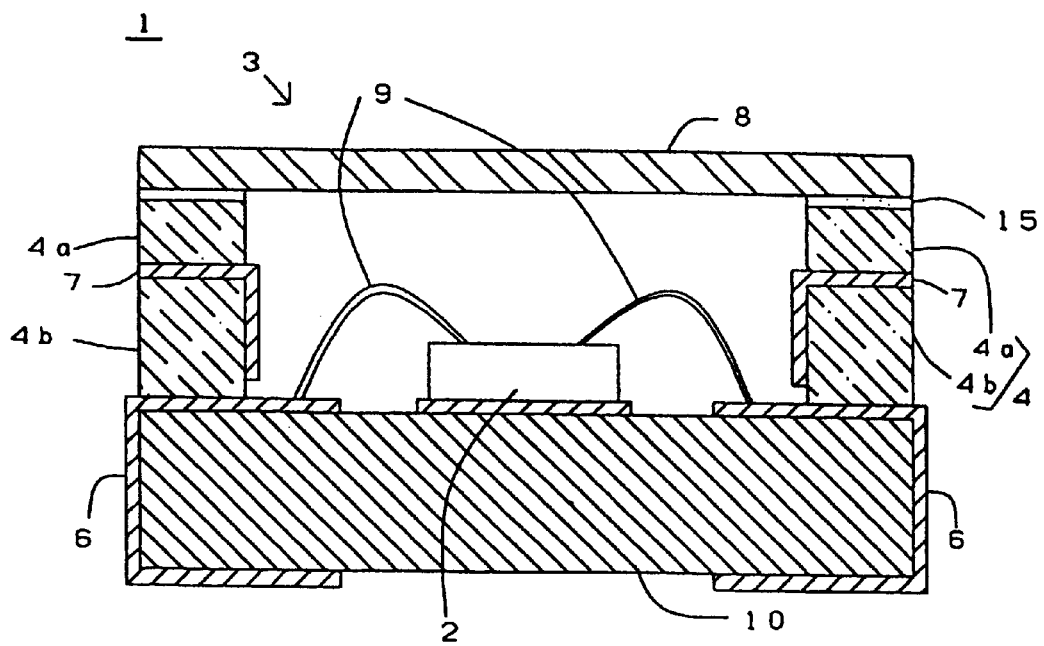
FIG. 4A is a longitudinal sectional view showing a modified preferred embodiment of the surface acoustic wave device according to the first preferred embodiment of the present invention.
Figure 4B:
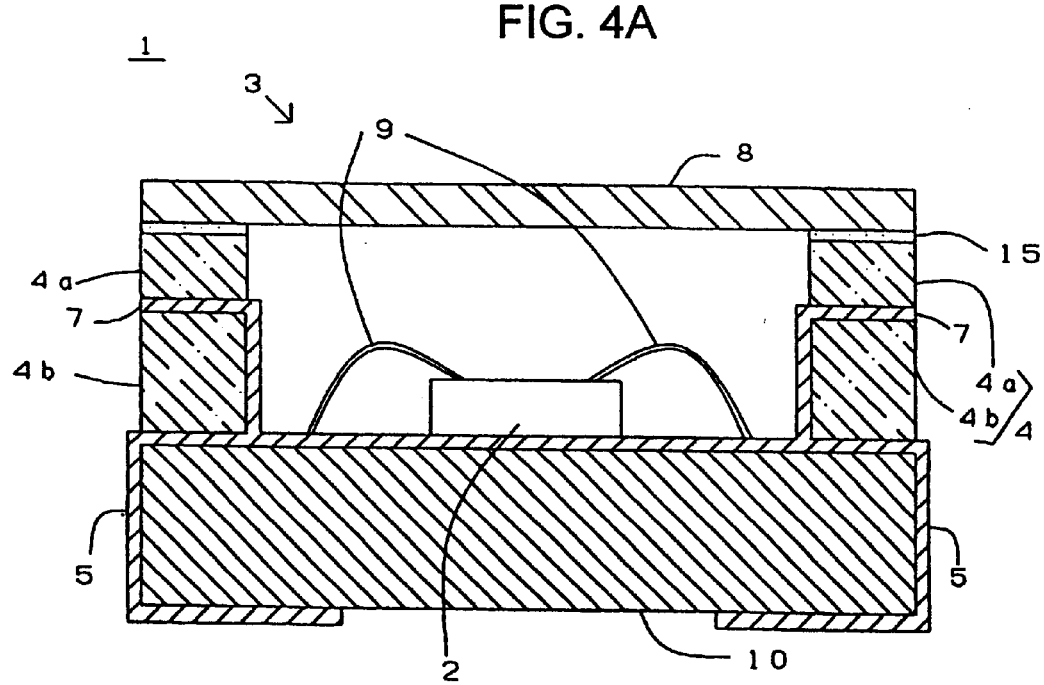
FIG. 4B is a longitudinal sectional view showing the modified preferred embodiment of the surface acoustic wave device according to the first preferred embodiment of the present invention.
Figure 5A:
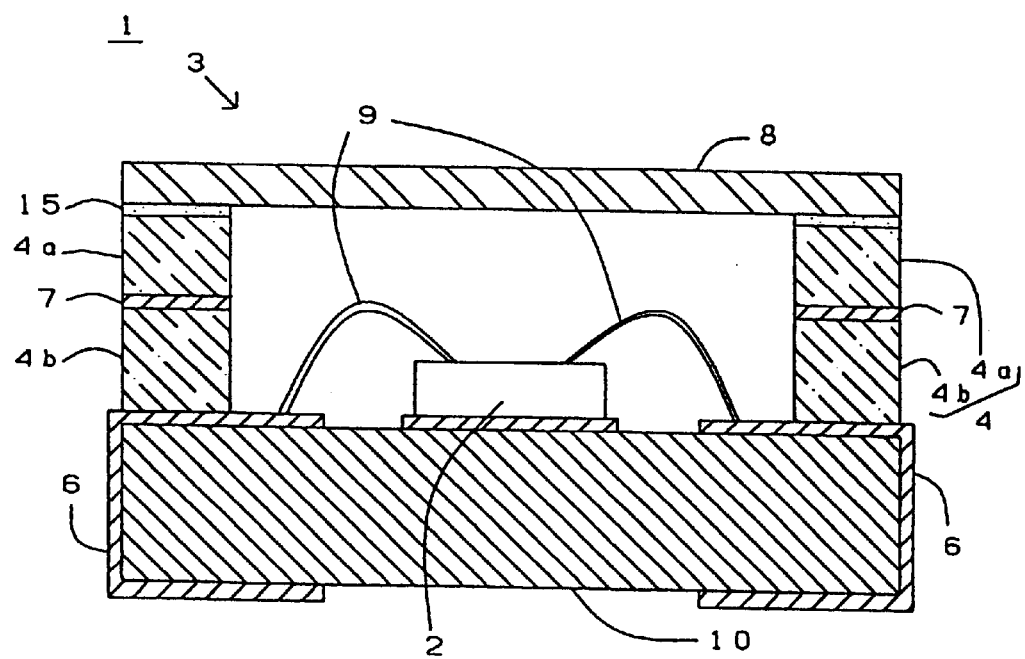
FIG. 5A is a longitudinal sectional view showing a modified preferred embodiment of the surface acoustic wave device according to the first preferred embodiment of the present invention.
Figure 5B:
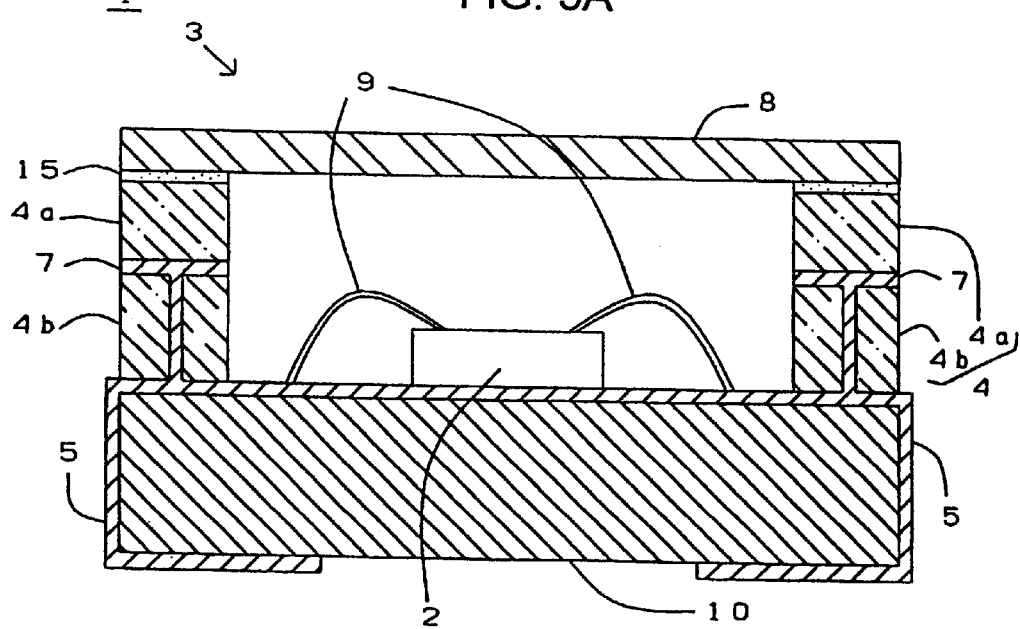
FIG. 5B is a longitudinal sectional view showing the modified preferred embodiment of the surface acoustic wave device according to the first preferred embodiment of the present invention.
Figure 6A:
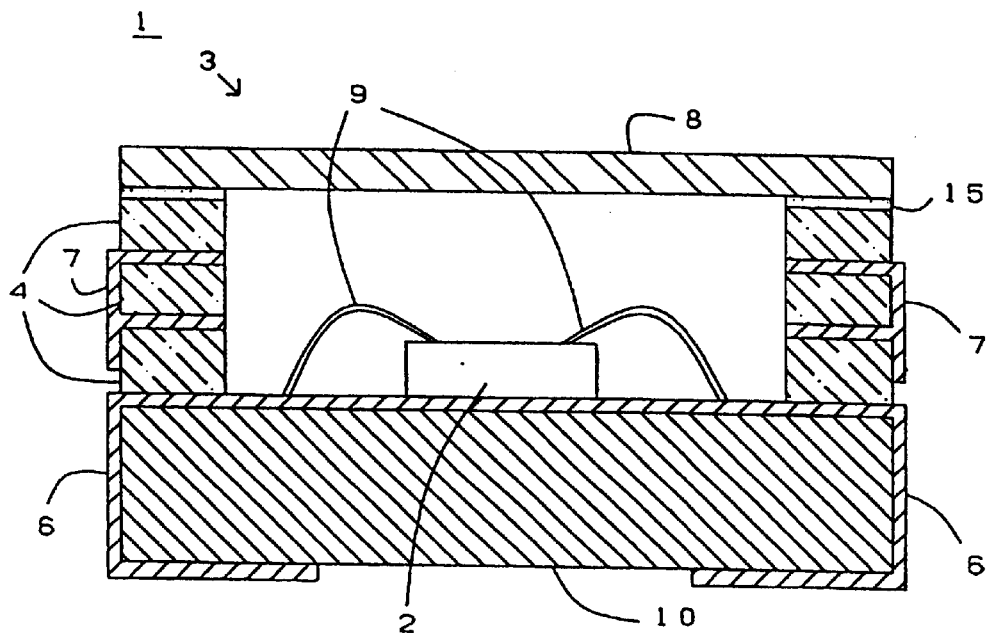
FIG. 6A is a longitudinal sectional view showing a modified preferred embodiment of the surface acoustic wave device according to the first preferred embodiment of the present invention.
Figure 6B:
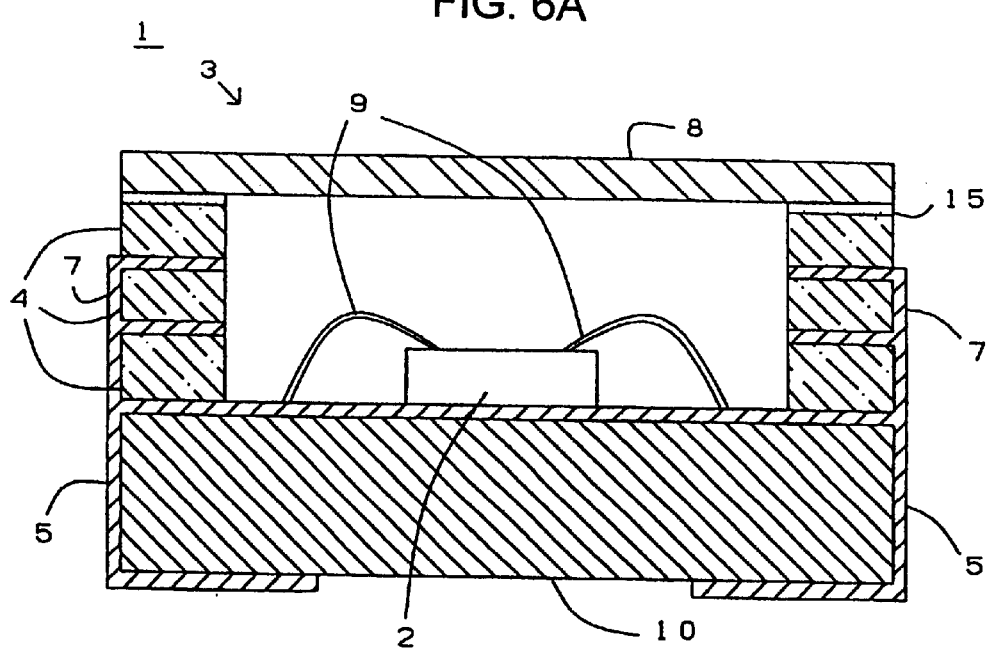
FIG. 6B is a longitudinal sectional view showing the modified preferred embodiment of the surface acoustic wave device according to the first preferred embodiment of the present invention.
Figure 7A:
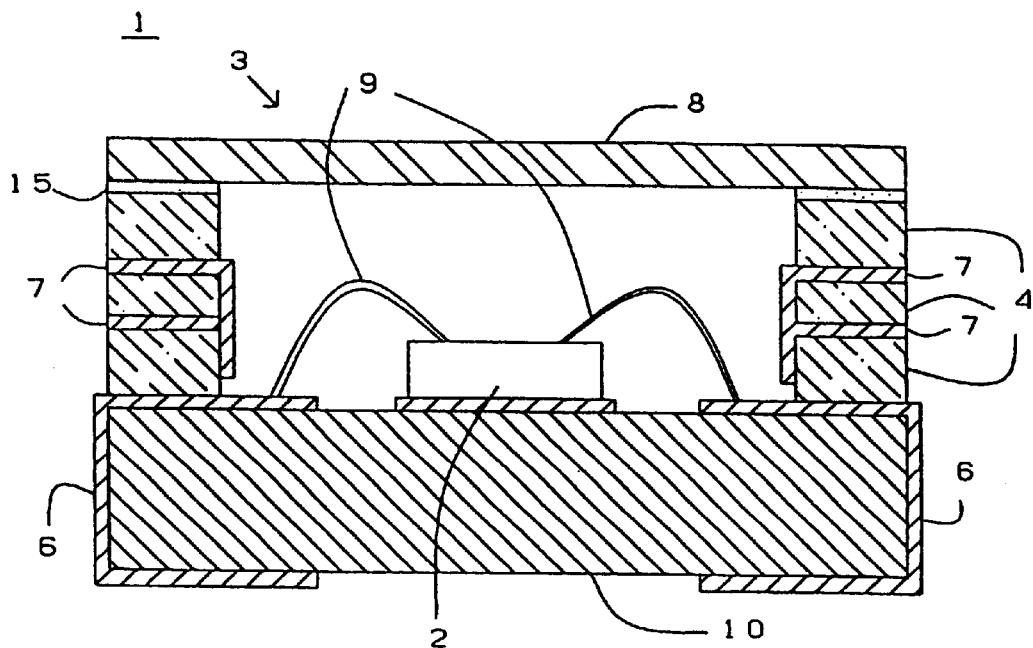
FIG. 7A is a longitudinal sectional view showing a modified preferred embodiment of the surface acoustic wave device according to the first preferred embodiment of the present invention.
Figure 7B:
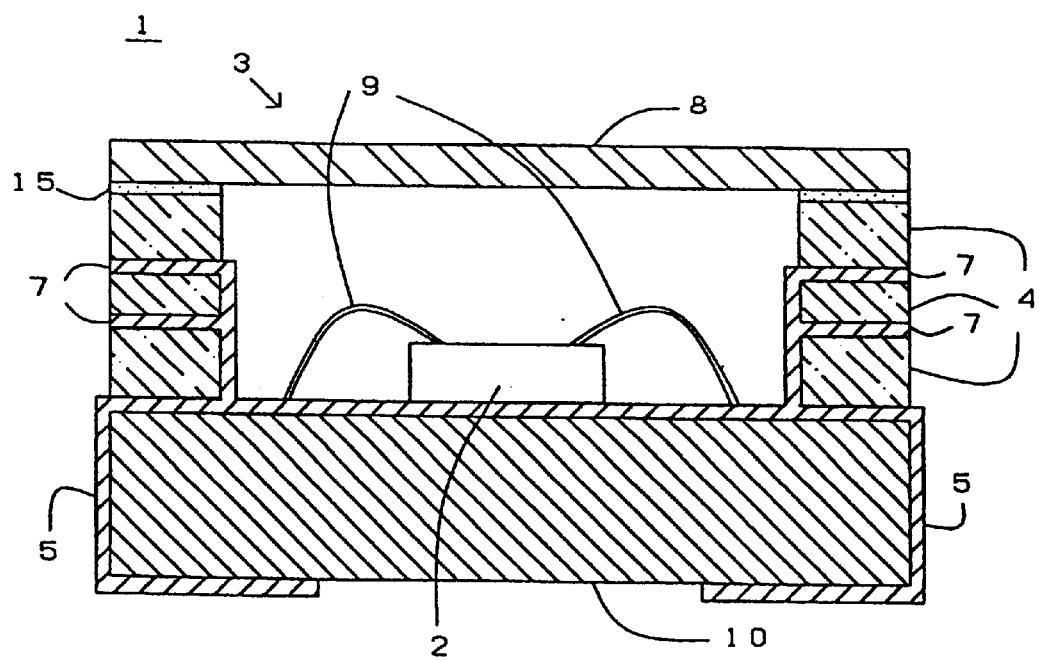
FIG. 7B is a longitudinal sectional view showing the modified preferred embodiment of the surface acoustic wave device according to the first preferred embodiment of the present invention.
Figure 8A:
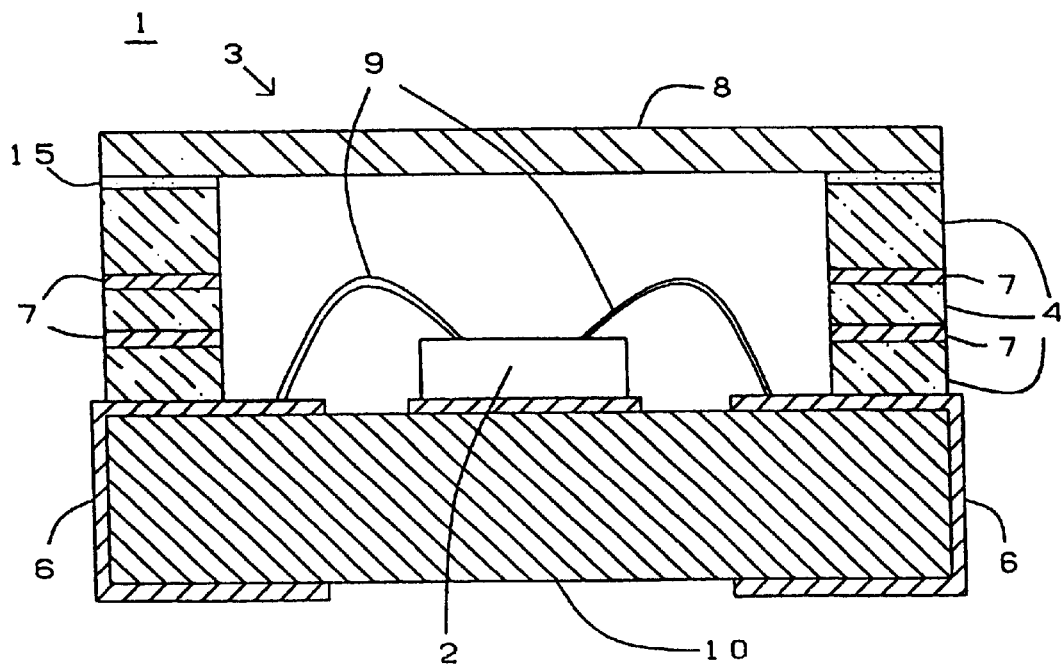
FIG. 8A is a longitudinal sectional view showing a modified preferred embodiment of the surface acoustic wave device according to the first preferred embodiment of the present invention.
Figure 8B:
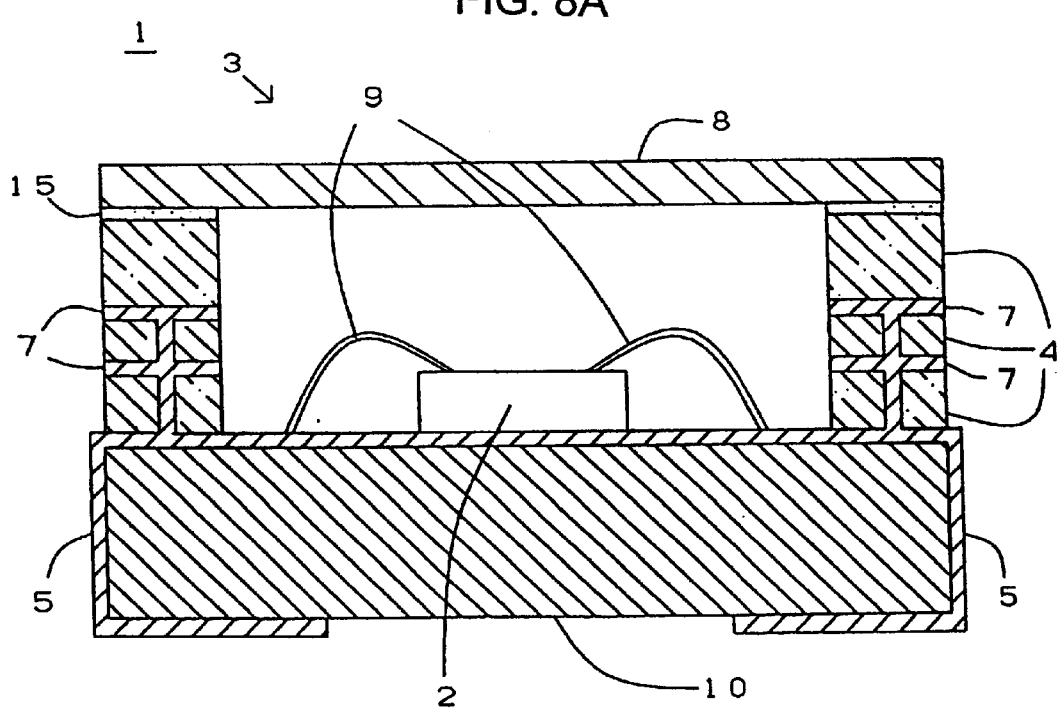
FIG. 8B is a longitudinal sectional view showing the modified preferred embodiment of the surface acoustic wave device according to the first preferred embodiment of the present invention.
Figure 9A:
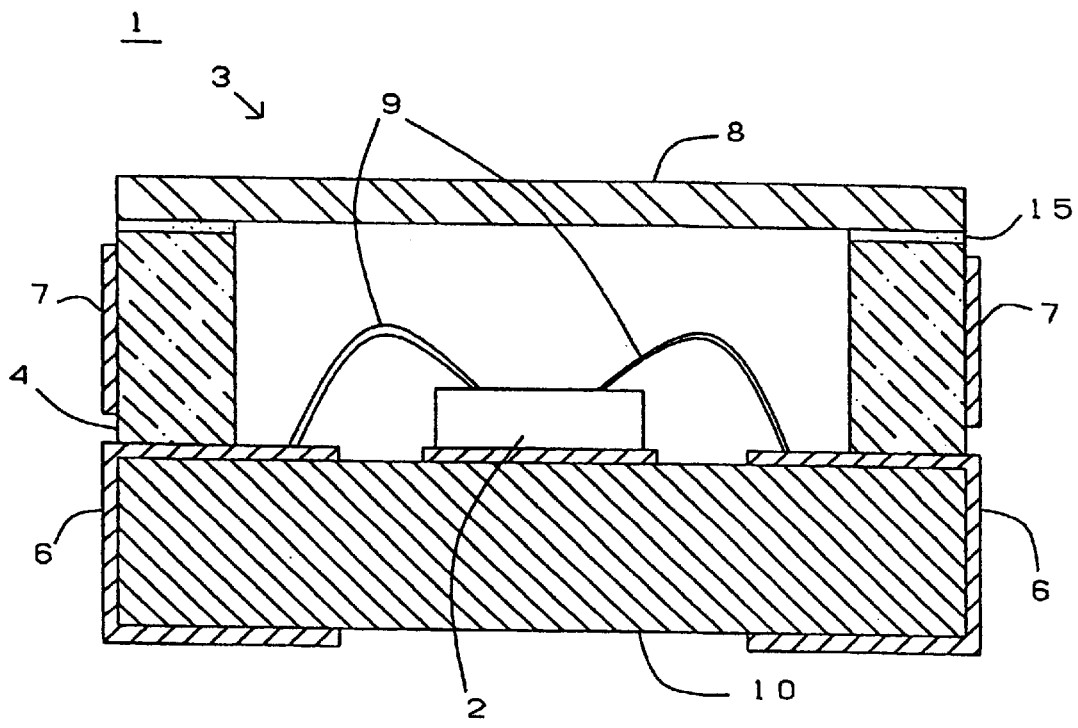
FIG. 9A is a longitudinal sectional view showing a modified preferred embodiment of the surface acoustic wave device according to the first preferred embodiment of the present invention.
Figure 9B:
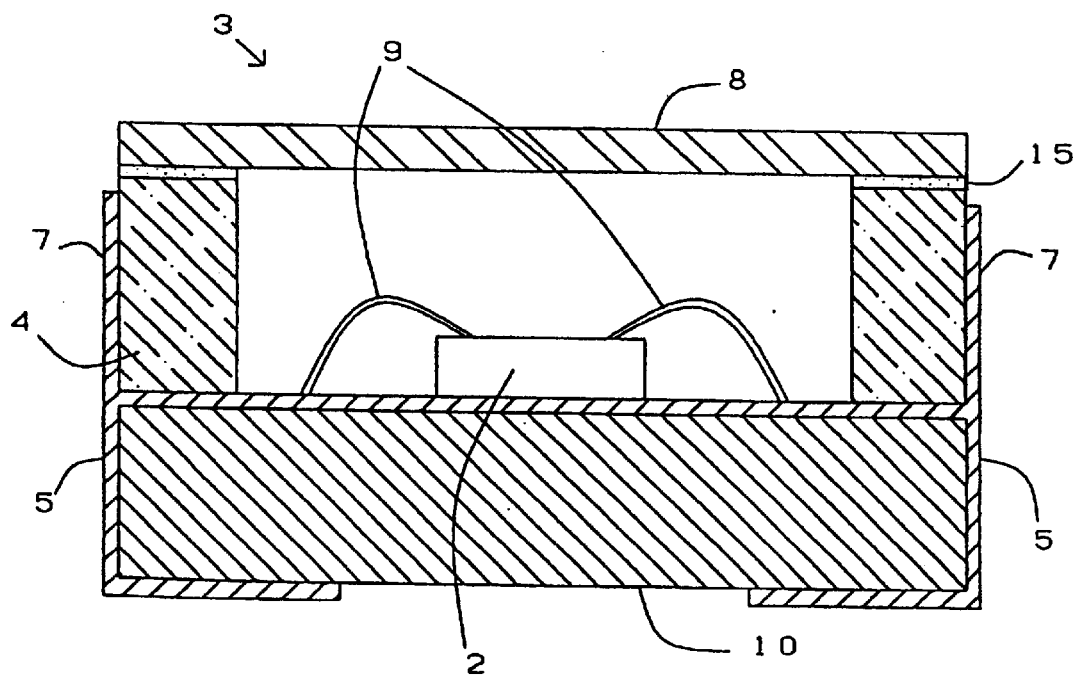
FIG. 9B is a longitudinal sectional view showing the modified preferred embodiment of the surface acoustic wave device according to the first preferred embodiment of the present invention.
Figure 10A:
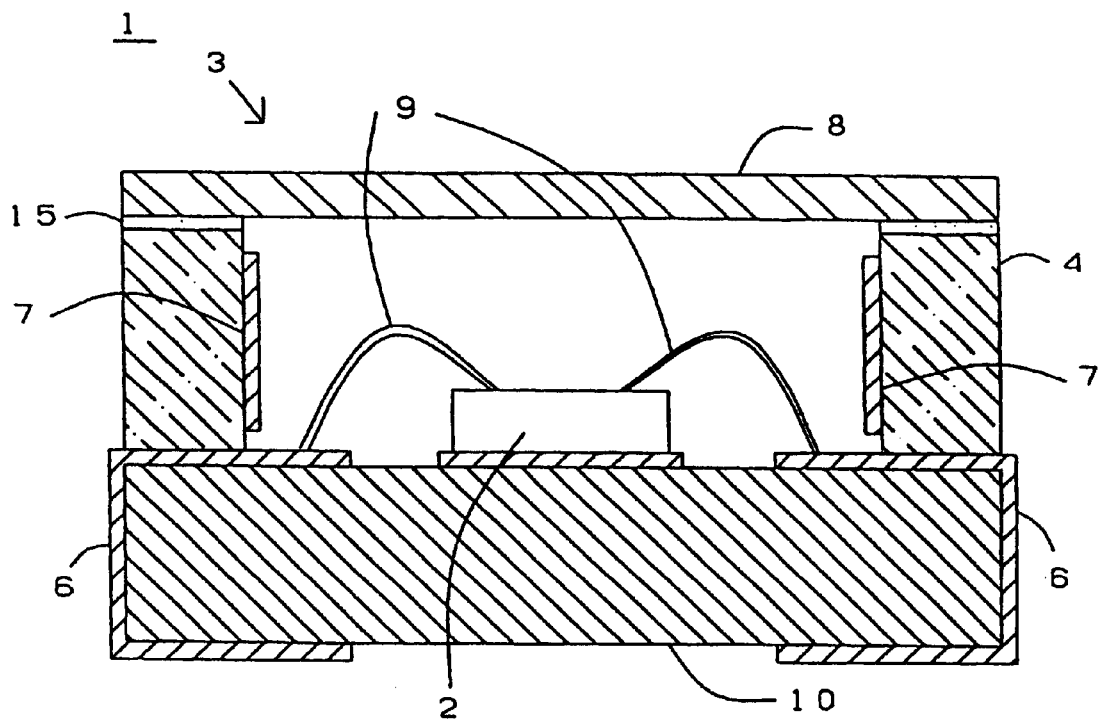
FIG. 10A is a longitudinal sectional view showing a modified preferred embodiment of the surface acoustic wave device according to the first preferred embodiment of the present invention.
Figure 10B:
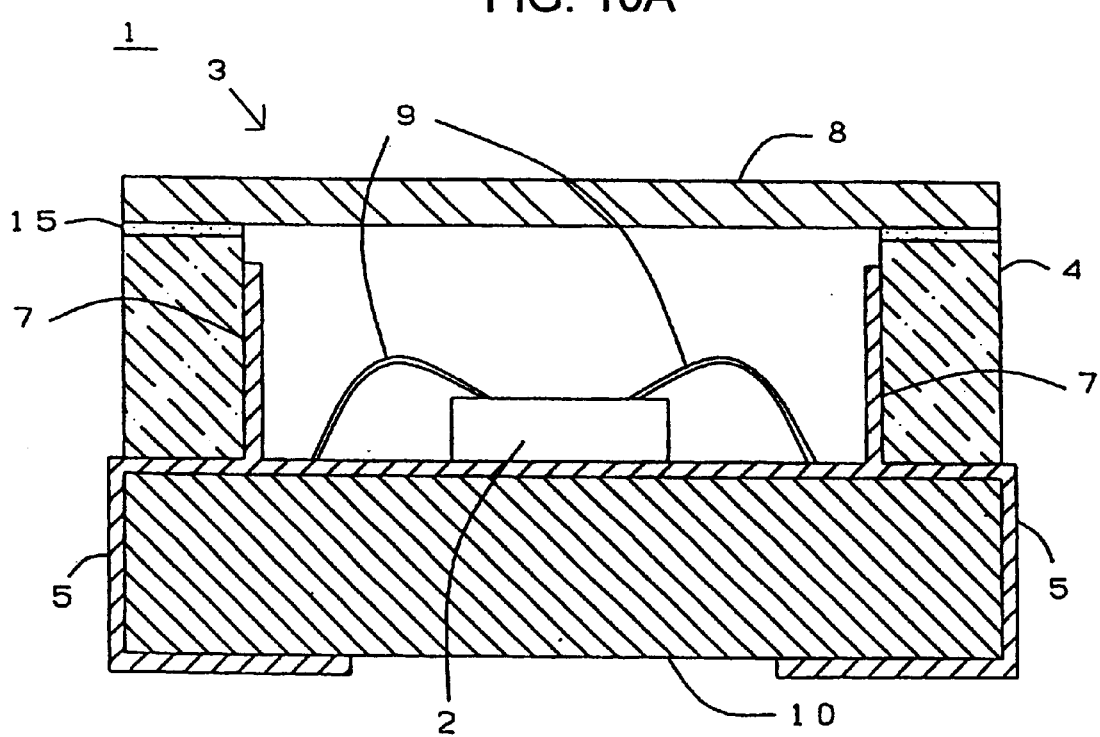
FIG. 10B is a longitudinal sectional view showing the modified preferred embodiment of the surface acoustic wave device according to the first preferred embodiment of the present invention.
Figure 11A:
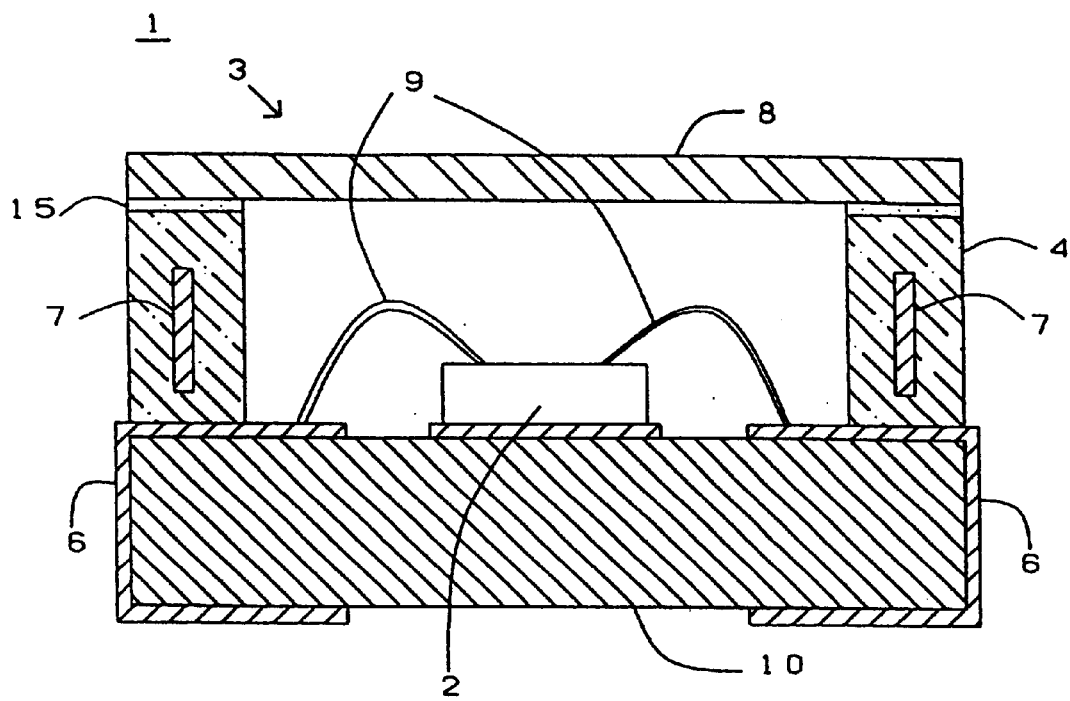
FIG. 11A is a longitudinal sectional view showing a modified preferred embodiment of the surface acoustic wave device according to the first preferred embodiment of the present invention.
Figure 11B:
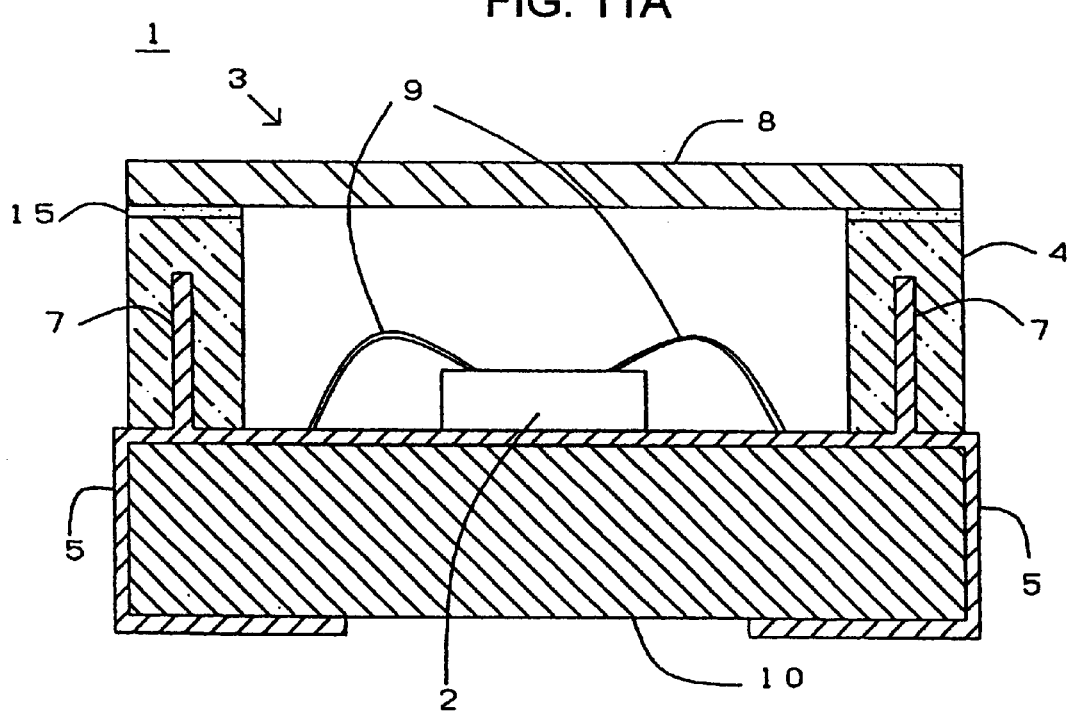
FIG. 11B is a longitudinal sectional view showing the modified preferred embodiment of the surface acoustic wave device according to the first preferred embodiment of the present invention.
Figure 12A:
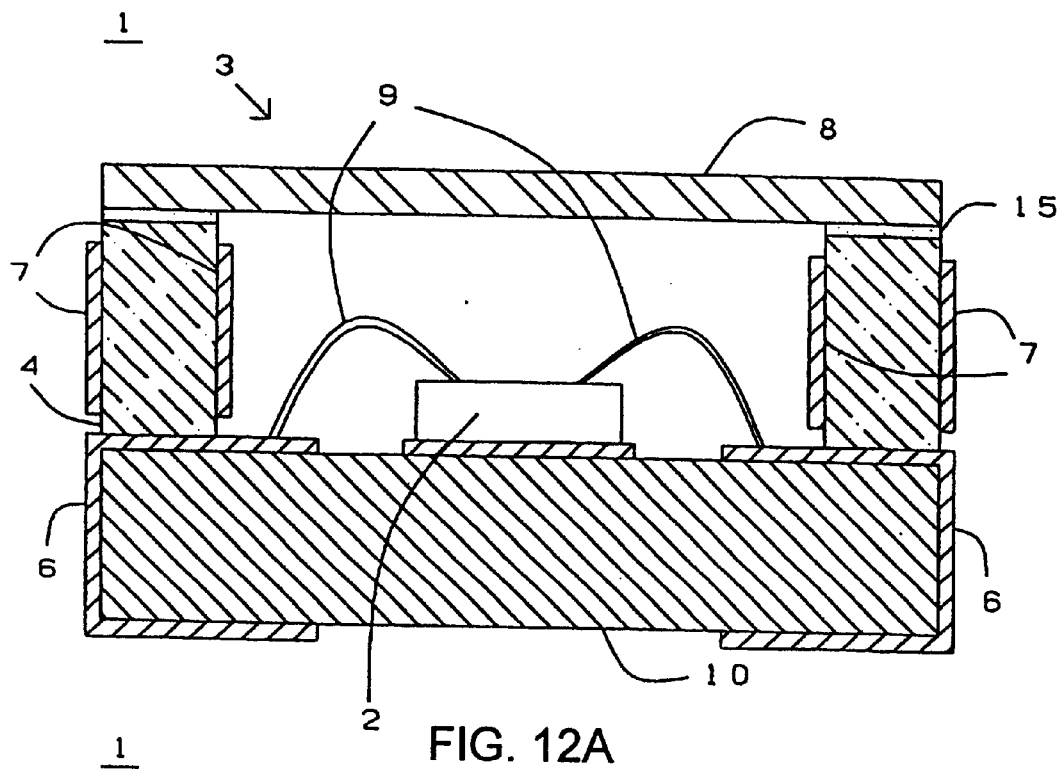
FIG. 12A is a longitudinal sectional view showing a modified preferred embodiment of the surface acoustic wave device according to the first preferred embodiment of the present invention.
Figure 12B:
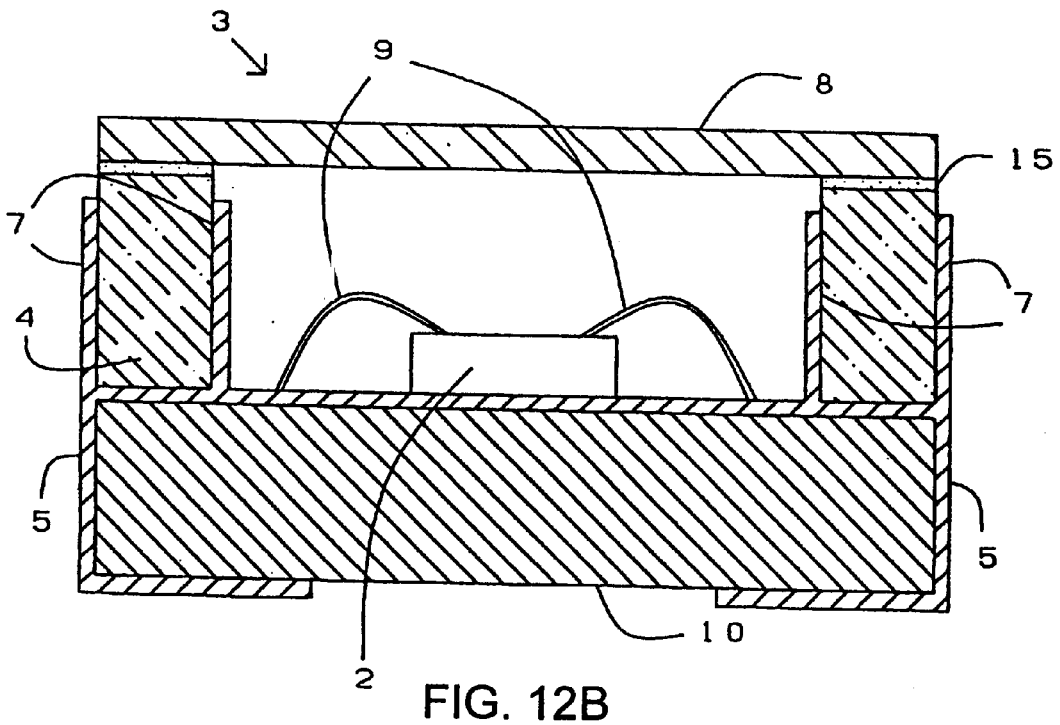
FIG. 12B is a longitudinal sectional view showing the modified embodiment of the surface acoustic wave device according to the first preferred embodiment of the present invention.
Figure 13A:
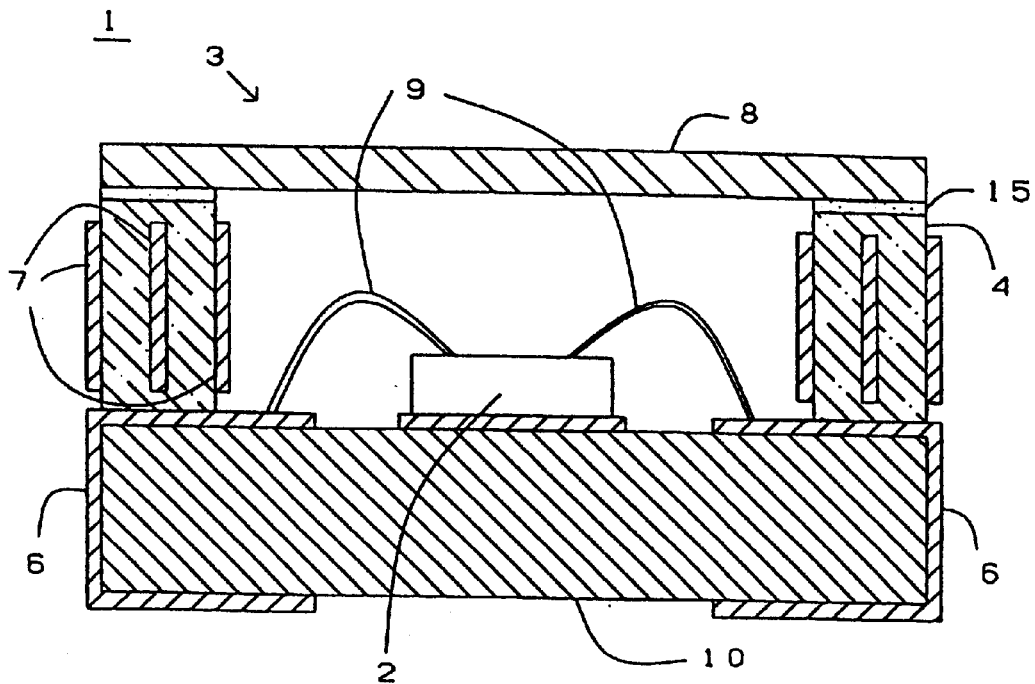
FIG. 13A is a longitudinal sectional view showing a modified preferred embodiment of the surface acoustic wave device according to the first preferred embodiment of the present invention.
Figure 13B:
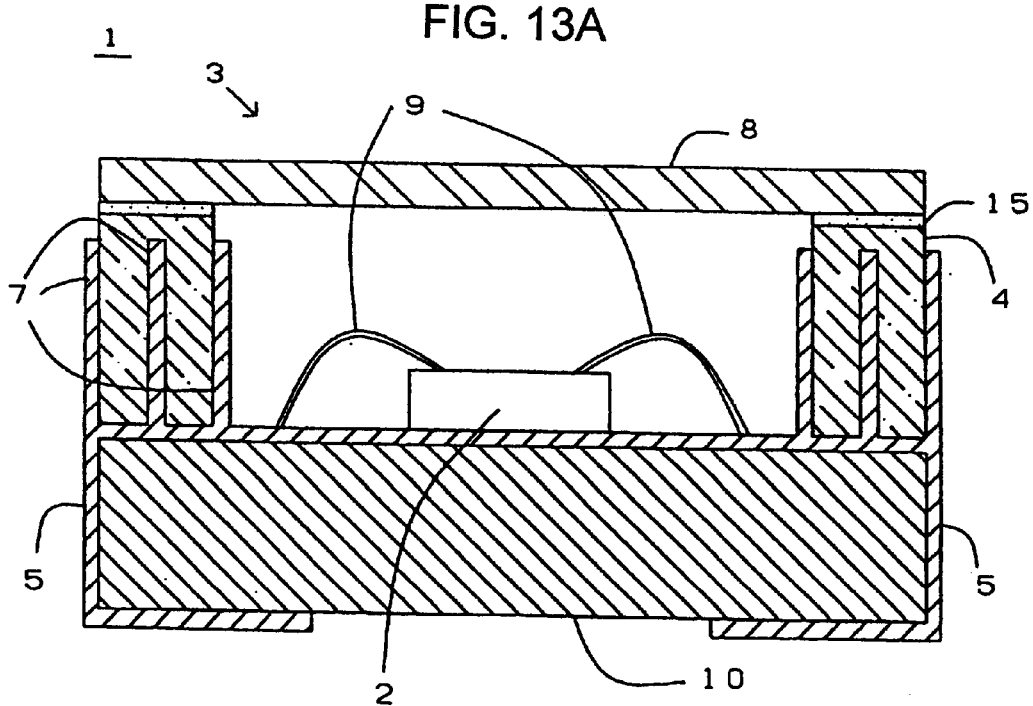
FIG. 13B is a longitudinal sectional view showing the modified preferred embodiment of the surface acoustic wave device according to the first preferred embodiment of the present invention.
Figure 14A:
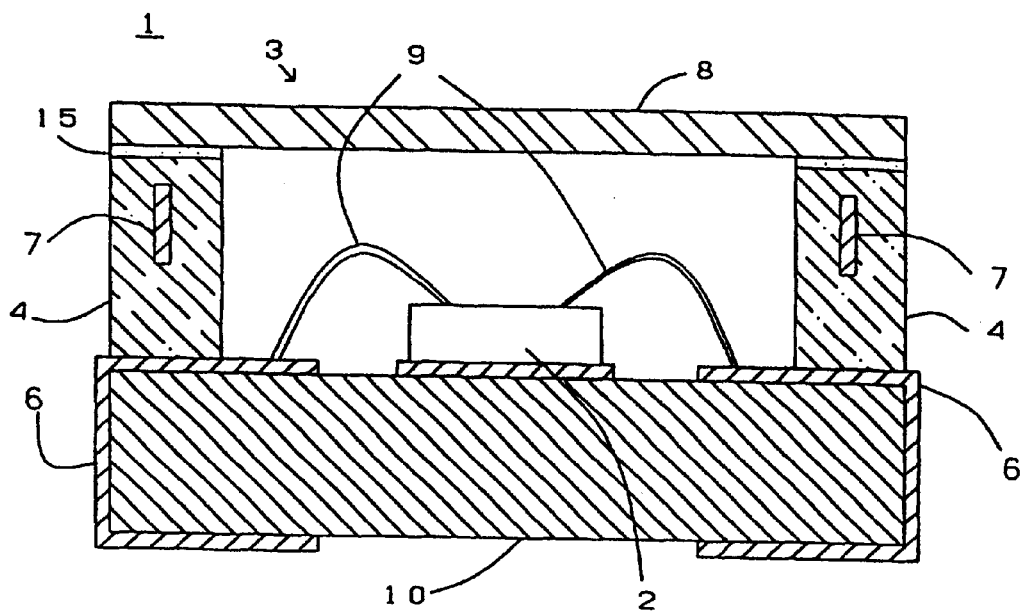
FIG. 14A is a longitudinal sectional view showing a modified preferred embodiment of the surface acoustic wave device according to the first preferred embodiment of the present invention.
Figure 14B:
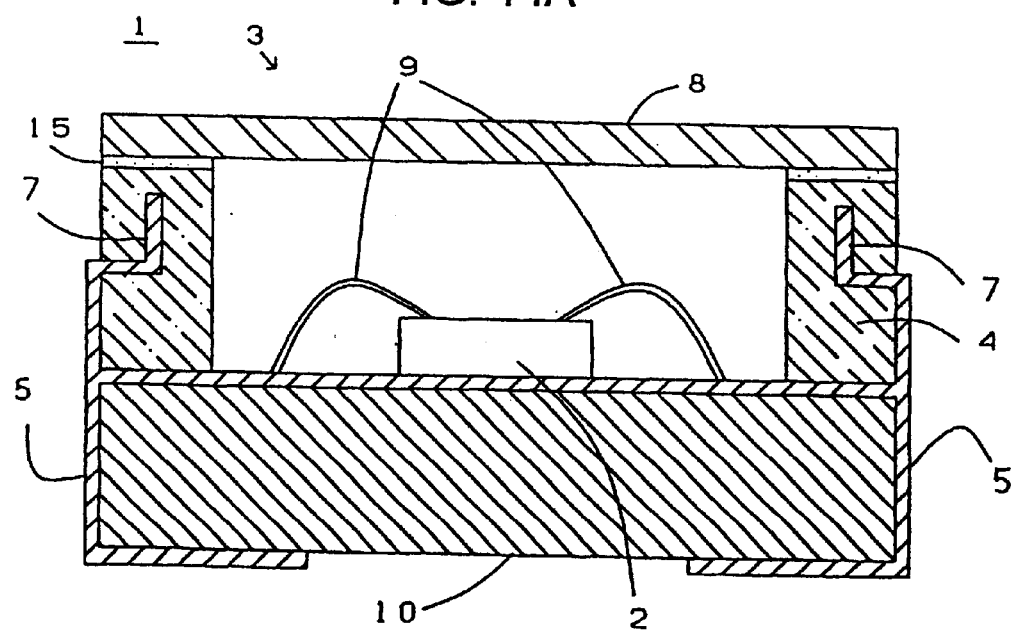
FIG. 14B is a longitudinal sectional view showing the modified preferred embodiment of the surface acoustic wave device according to the first preferred embodiment of the present invention.
Figure 15A:
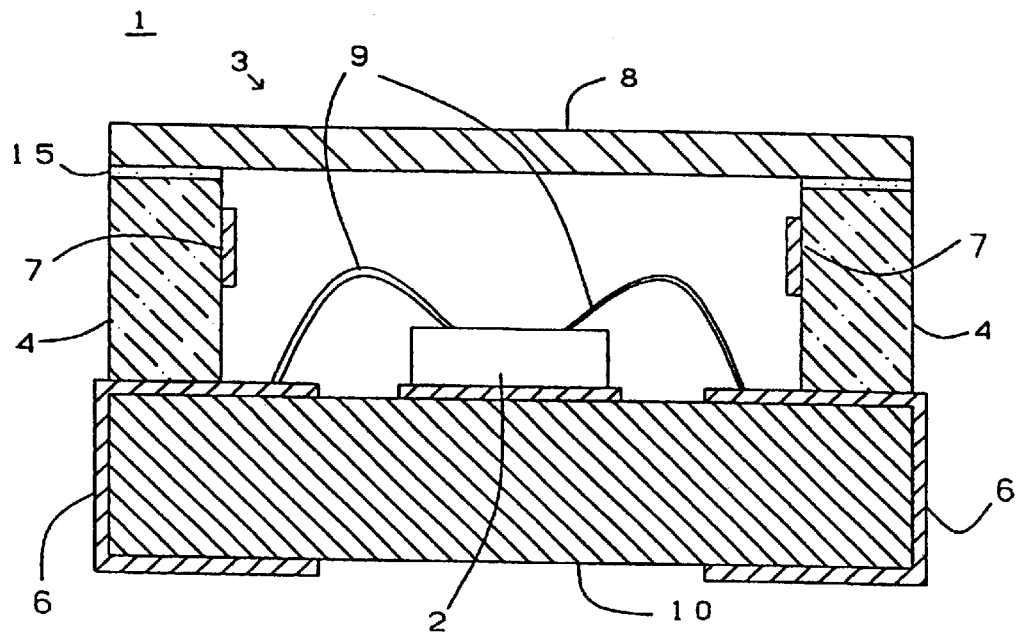
FIG. 15A is a longitudinal sectional view showing a modified preferred embodiment of the surface acoustic wave device according to the first preferred embodiment of the present invention.
Figure 15B:
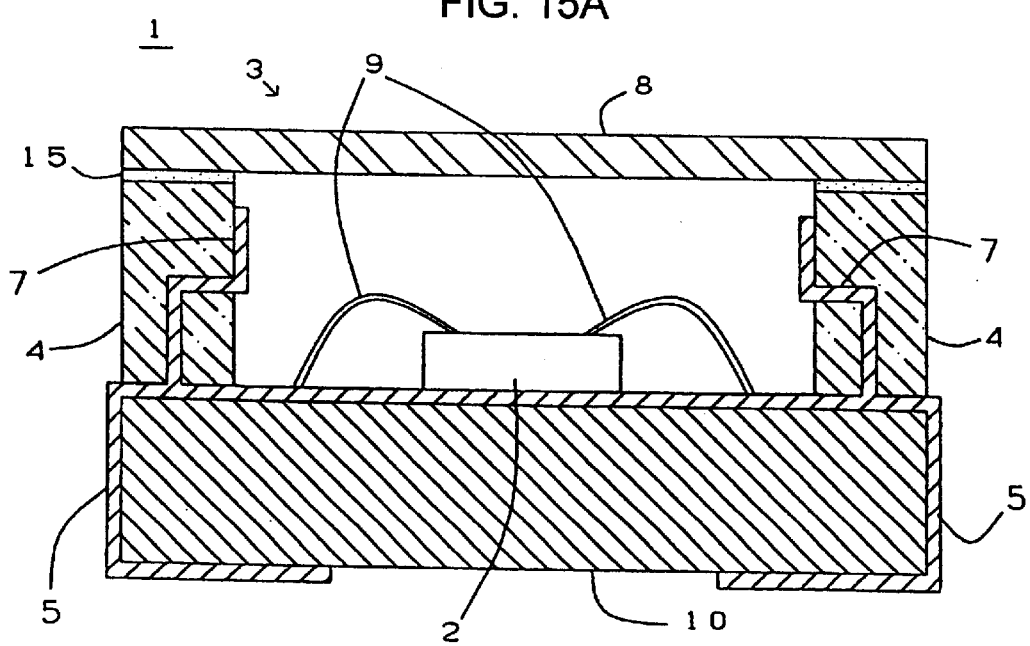
FIG. 15B is a longitudinal sectional view showing the modified preferred embodiment of the surface acoustic wave device according to the first preferred embodiment of the present invention.

FIGS. 1A, 1B, 2A, and 2B show a first preferred embodiment of a surface acoustic wave device of the present invention. FIG. 1A is a perspective view showing a surface acoustic wave device 1, and FIG. 1B is an exploded perspective view of the surface acoustic wave device 1. Furthermore, FIG. 2A is a sectional view taken along line A–A' of FIG. 1A, and FIG. 2B is a sectional view taken along line B–B' of FIG. 1A.

The surface acoustic wave device 1 preferably includes a surface acoustic wave element 2 and a package 3 that is made of, for example, an insulating material or ceramics and contains the surface acoustic wave element 2 therein. The package 3 includes a main body having an opening and a hollow space therein and a cover 8 for closing the opening of the main body of the package. In the present preferred embodiment, the main body of the package preferably includes a substrate 10 made of alumina or other suitable material, and one or a plurality of frame bodies, which has a substantially square shape when seen from above, provided on the periphery of the substrate 10.

The surface acoustic wave element 2 is fixed substantially in the center of the substrate 10 by using, for example, a conductive adhesive (not illustrated). Furthermore, the electrodes (not illustrated) of the surface acoustic wave element 2 are electrically connected to a grounding electrode 5 and signal electrodes 6 preferably via wire bonding using a metal wire 9 or via other suitable connections.

The grounding electrode 5 is arranged so as to connect the vicinity of the middle point of each of a pair of two facing sides on the surface of the substrate 10 on which the surface acoustic wave element 2 is fixed, and is in contact with the bottom surface of the surface acoustic wave element 2. Moreover, the grounding electrode 5 is arranged so as to continuously extend over the outside surface and bottom surface of the substrate 10. The surface acoustic wave element 2 is grounded by the grounding electrode 5 such that the grounding electrode 2 absorbs an unwanted electromagnetic wave generated by the surface acoustic wave element 2.

Furthermore, the signal electrodes 6 extend in the direction of the surface acoustic wave from the vicinity of the middle point of each of the other pair of two facing sides of the substrate 10, respectively, and are also arranged so as to continuously extend over the outside surface and bottom surface of the substrate 10. The signal electrodes 6 are also located a certain distance away from the surface acoustic wave element 2 so as not to be in contact with the grounding electrode 5 in the vicinity of the surface acoustic wave element 2 on the substrate 10. A signal from the surface acoustic wave element 2 or from the outside can be output or input through these signal electrodes 6, and thus, the communication to each other can be achieved.

In the present preferred embodiment, the frame body 4 preferably includes two layers of an upper frame body 4a and a lower frame body 4b. Between the substrate 10 and the lower frame body 4b, the grounding electrode 5 and the signal electrodes 6 extend toward the outside surface of the substrate 10 from the side of the surface acoustic wave element 2, respectively, and each of them further extends to the bottom surface of the substrate 10 through the outside surface. This is because the mounted circuit can be easily made conductive when the surface acoustic wave device 1 is mounted.

A metallized electrode 7 preferably made of gold or other suitable material, is provided between the upper frame body 4a and the lower frame body 4b so that the metallized electrode 7 is the embedded in the frame body 4. The metallized electrode 7 preferably has a substantially rectangular frame shape that surrounds the surface acoustic wave element 2 above the surface acoustic wave element 2. This metallized electrode 7 contacts the grounding electrode 5 extending further toward the upper portion of the package 3 from the outside surface of the substrate 10, and it is made possible to ground the metallized electrode 7. In this way, an unwanted electromagnetic wave is absorbed by the grounding electrode 5 and the inside of the package 3 is electrically shielded through the grounding.

The upper frame body 4a and the lower frame body 4b are not required to have the same size, and, for example, the lower frame body 4b may be slightly protruded toward the surface acoustic wave element 2.

On the upper surface of the frame body 4, the cover 8 made of, for example, an insulating resin, ceramics, or other suitable material, is arranged so as to close the opening portion of the main body of the package. The cover 8 and the frame body 4 are joined by using an insulating joining material 15 such as, for example, an insulating adhesive, fused glass by heat, or other suitable material. More specifically, the insulating joining material 15 is preferably disposed on the whole area of the upper surface of the frame body 4.

Furthermore, in the first preferred embodiment, one metallized electrode 7 that is substantially parallel to the substrate 10 is provided between the upper frame body 4a and the lower frame body 4b, but the present invention is not limited thereto. If only the metallized electrode 7 is arranged so as to be located over the signal electrodes 6 and not to be in contact with the signal electrodes 6 and the insulating joining material 15, and is in contact with the grounding electrode 5, the location and number of the metallized electrode are not restricted.

Furthermore, the metallized electrode 7 is not required to be disposed over the whole area of the periphery of the frame body 4. If the metallized electrode 7 contacts the grounding electrode 5, a part of the metallized electrode 7 may be disconnected. Furthermore, in this first preferred embodiment, although the frame body 4 is provided on the periphery of the substrate, the number of the frame bodies 4 is not restricted and, for example, one frame body may be provided. Furthermore, the frame body 4 may be integrally formed together with the substrate 10 so as to constitute a single unitary member.

Furthermore, the grounding electrode 5 and the signal electrodes 6 are not restricted to the above-described electrode patterns, and the electrodes may be modified under various conditions within the scope of the present invention.

FIGS. 3A to 15B show the modified preferred embodiments of the surface acoustic wave device 1 according to the first preferred embodiment of the present invention in which Drawing A in each modified preferred embodiment is a longitudinal sectional view of a part corresponding to the portion along line A–A' of FIG. 1A and Drawing B in each modified preferred embodiment is a longitudinal sectional view of a part corresponding to the portion along line B–B' of FIG. 1A. For example, as shown in FIGS. 3A, 3B, 11A, and 11B, a metallized electrode which is substantially parallel or substantially perpendicular to the substrate is embedded in one frame body. As shown in FIGS. 3A to 5B, and 7A to 8B, the grounding electrode 5, extending upward on the inner surface of the frame body or via a through-hole (not illustrated) provided inside the frame body 4, is conductive to the metallized electrode 7. As shown in FIGS. 6A to 8B, a plurality of metallized electrodes 7 that are substantially parallel to the substrate 10 are provided. As shown in FIGS. 9A to 13B, one or a plurality of metallized electrodes 7 that are substantially perpendicular to the substrate 10 are provided. As shown in FIGS. 14A to 15B, a metallized electrode 7, which is substantially parallel to the substrate 10, and a metallized electrode 7, which is substantially perpendicular to the substrate 10, can be connected in combination to the grounding electrode 5.

Figure 16A:
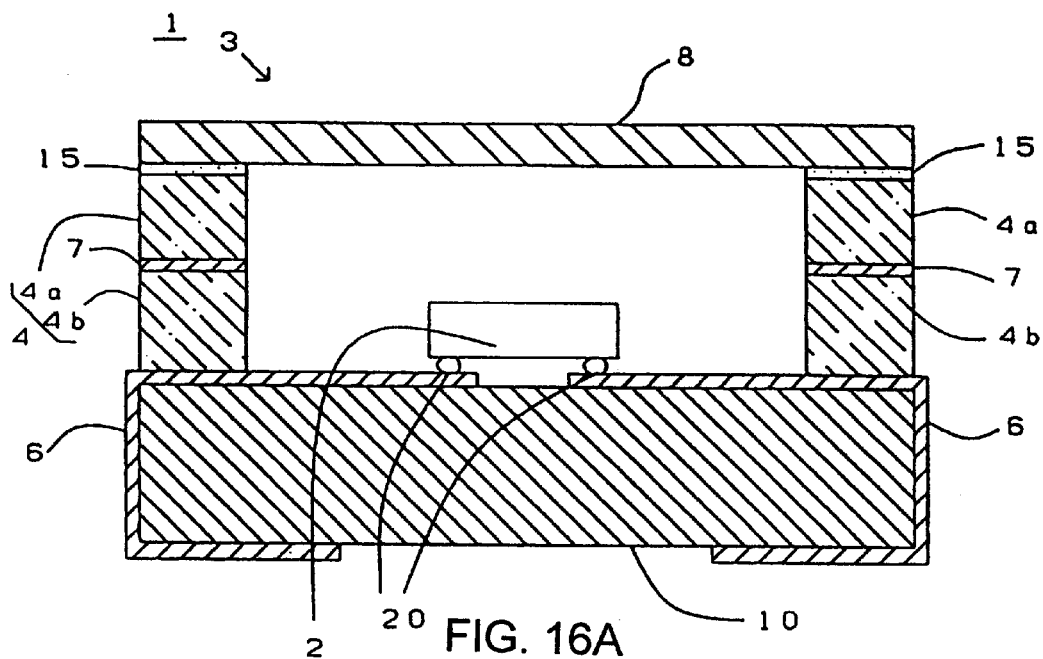
FIG. 16A is a longitudinal sectional view showing a modified preferred embodiment of the surface acoustic wave device according to the first preferred embodiment of the present invention.
Figure 16B:
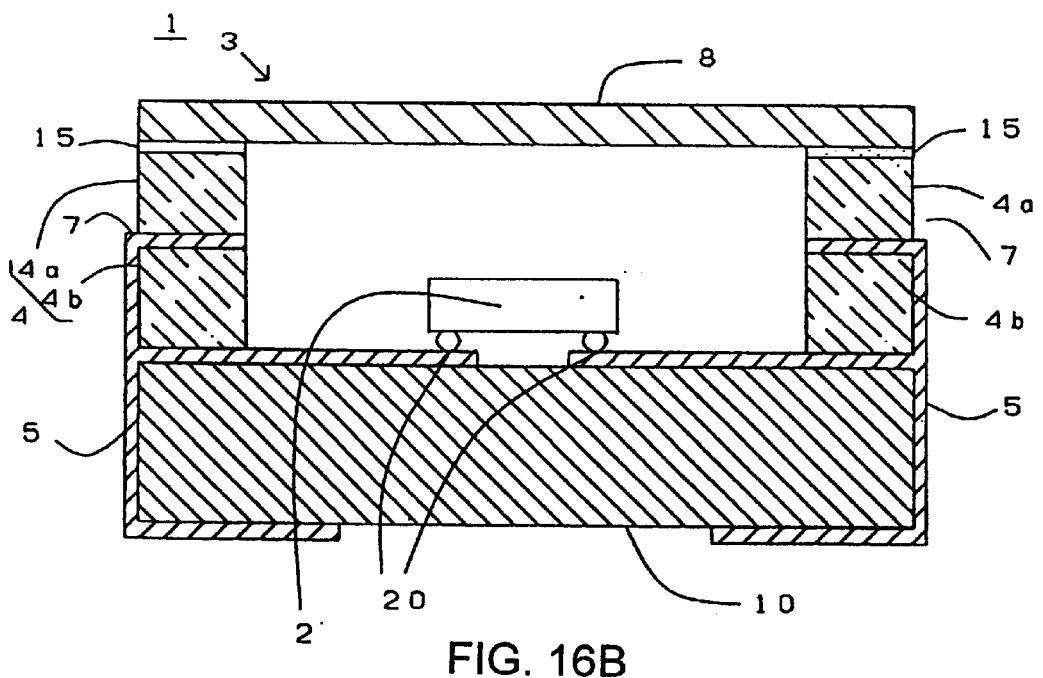
FIG. 16B is a longitudinal sectional view showing the modified preferred embodiment of the surface acoustic wave device according to the first preferred embodiment of the present invention.

Moreover, in this first preferred embodiment, the grounding electrode 5 and the signal electrodes 6 were made conductive via wire bonding, but the present invention is not limited to this. As shown in FIG. 16A which is a longitudinal sectional view of a part corresponding to the portion along line A–A' of FIG. 1A and FIG. 16B which is a longitudinal sectional view of a part corresponding to the portion along line B–B' of FIG. 1A, metal bumps 20 are provided between the bottom surface of the surface acoustic wave element 2 and the grounding electrode 5 and between the bottom surface of the surface acoustic wave element 2 and the signal electrodes 6. Thus, the surface acoustic wave element 2 is electrically conductive to the grounding electrode 5 and the signal electrodes 6, such that face down bonding may be used.

Figure 17A:
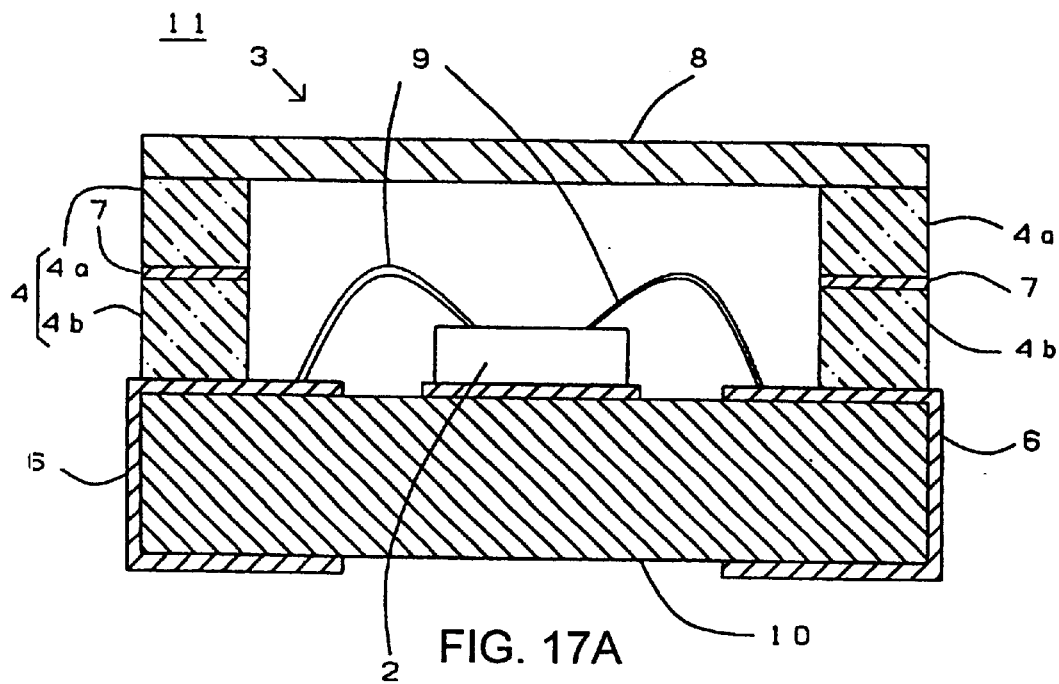
FIG. 17A is a longitudinal sectional view of a surface acoustic wave device according to a second preferred embodiment of the present invention.
Figure 17B:
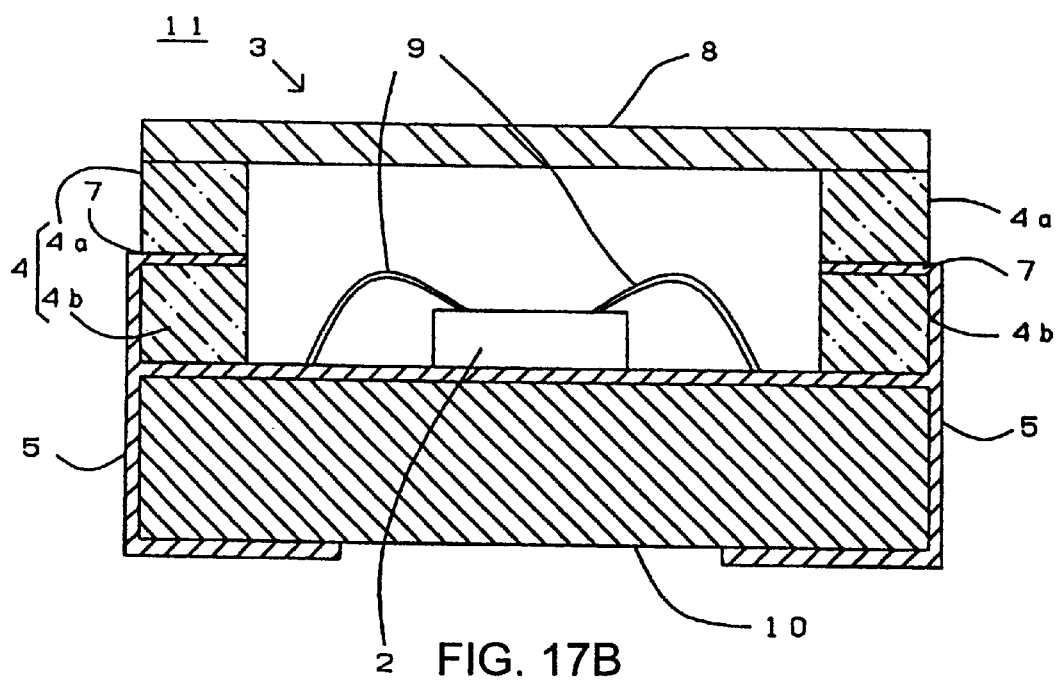
FIG. 17B is a longitudinal sectional view of the surface acoustic wave device according to the second preferred embodiment of the present invention.

FIGS. 17A and 17B are longitudinal sectional views showing a surface acoustic wave device 11 according to a second preferred embodiment of the present invention in which the cover 8 and the frame body 4 are joined by thermocompression bonding. FIG. 17A is a longitudinal sectional view of a part corresponding to the portion along line A–A' of the surface acoustic wave device of FIG. 1A, and FIG. 17B is a longitudinal sectional view of a part corresponding to the portion along line B–B' of the surface acoustic wave device of FIG. 1A. Moreover, as the component of each part is substantially the same as that in the surface acoustic wave device 1 of the first preferred embodiment, the common part is given the same reference numeral and its description is omitted.

As shown in FIGS. 17A and 17B, when both the cover 8 and the frame body 4 are made of an insulating resin, they may be joined by thermocompression bonding without using the insulating joining material 15. Moreover, in FIGS. 17A and 17B, the package 3 shown in FIGS. 1A to 2B is preferably constructed via thermocompression bonding, but the present invention is not restricted to this, and the location and number of the metallized electrodes 7, the number of the frame bodies 4, the bonding method, and other factors, can be modified by applying the contents described in the above first preferred embodiment correspondingly.

As described above, according to various preferred embodiments of the present invention, because no metallized electrode is joined by the insulating joining material, a much greater and reliably sufficient joining strength can be obtained. Therefore, the penetration of the moisture into the package is reliably prevented. Furthermore, because the metallized electrode which is provided at a fixed location of the main body of the package so as to be located above the signal electrodes and not to be in contact with the signal electrodes and the insulating joining material and which is made conductive to the grounding electrode so that the grounding electrode absorbs and grounds an unwanted electromagnetic wave, the inside of the package can be sufficiently shielded.

Furthermore, according to preferred embodiments of the present invention, even in the case of a surface acoustic wave device in which the cover and the main body of the package made of an insulating material are joined by thermocompression bonding, the inside of the package can be fully shielded.

While the present invention has been particularly shown and described with reference to preferred embodiments thereof, it will be understood by those skilled in the art that the foregoing and other changes in form and details can be made without departing from the spirit and scope of the invention.

What is claimed is:

1. A surface acoustic wave device comprising:

a surface acoustic wave element; and a package containing the surface acoustic wave element, the package including a main body having an opening and a hollow space therein, a cover provided on the upper surface of the main body of the package and arranged to close the opening portion of the main body of the package, signal electrodes arranged to transmit a signal input from the outside of the package and a signal output from the surface acoustic wave element, and a grounding electrode for grounding an unwanted electromagnetic wave generated inside the package; wherein an insulating joining material is arranged to join the main body of the package and the cover, a metallized electrode which is located above the signal electrodes and is not in contact with the signal electrodes and is not in contact with the insulating joining material, the metallized electrode being provided at a fixed location of the main body of the package, and the metallized electrode is electrically connected to the grounding electrode.

2. The surface acoustic wave device according to claim 1, wherein the package is made of one of an insulating material and ceramics.

3. The surface acoustic wave device according to claim 1, wherein the main body of the package includes a substrate and at least one frame body provided on the periphery of the substrate.

4. The surface acoustic wave device according to claim 3, wherein the surface acoustic wave element is fixed substantially in the center of the substrate.

5. The surface acoustic wave device according to claim 1, wherein the surface acoustic wave element is electrically connected to the grounding electrode and the signal electrodes.

6. The surface acoustic wave device according to claim 3, wherein the grounding electrode is arranged so as to connect the vicinity of the middle point of each of a pair of two facing sides on the surface of the substrate on which the surface acoustic wave element is fixed.

7. The surface acoustic wave device according to claim 1, wherein the grounding electrode is in contact with the bottom surface of the surface acoustic wave element.

8. The surface acoustic wave device according to claim 3, wherein the grounding electrode is arranged so as to continuously extend over the outside surface and bottom surface of the substrate.

9. The surface acoustic wave device according to claim 1, wherein the surface acoustic wave element is grounded by the grounding electrode such that the grounding electrode absorbs an unwanted electromagnetic wave generated by the surface acoustic wave element.

10. The surface acoustic wave device according to claim 3, wherein the at least one frame body includes two layers defining an upper frame body and a lower frame body.

11. A surface acoustic wave device comprising:

a surface acoustic wave element; and a package containing the surface acoustic wave element, the package made up of a main body of the package of an insulating material having a hollow apace therein, a cover of an insulating material provided on the upper surface of the main body of the package and for closing the opening portion of the main body of the package, signal electrodes for transmitting a signal input from the outside of the package and a signal output from the surface acoustic wave element, and a grounding electrode for grounding an unwanted electromagnetic wave generated inside the package; wherein the main body of the package and the cover are joined at bonding surfaces of the package and the cover by thermocompression bonding, a metallized electrode which is located above the signal electrodes and is not in contact with the signal electrodes and is not in contact with the bonding surfaces of the package and the cover, the metallized electrode being provided at a fixed location of the main body of the package, and the metallized electrode is electrically connected to the grounding electrode.

12. The surface acoustic wave device according to claim 11, wherein the package is made of one of an insulating material and ceramics.

13. The surface acoustic wave device according to claim 11, wherein the main body of the package includes a substrate and at least one frame body provided on the periphery of the substrate.

14. The surface acoustic wave device according to claim 13, wherein the surface acoustic wave element is fixed substantially In the center of the substrate.

15. The surface acoustic wave device according to claim 11, wherein the surface acoustic wave element is electrically connected to the grounding electrode and the signal electrodes.

16. The surface acoustic wave device according to claim 13, wherein the grounding electrode is arranged so as to connect the vicinity of the middle point of each of a pair of two facing sides on the surface of the substrate on which the surface acoustic wave element is fixed.

17. The surface acoustic wave device according to claim 11, wherein the grounding electrode is in contact with the bottom surface of the surface acoustic wave element.

18. The surface acoustic wave device according to claim 13, wherein the grounding electrode is arranged so as to continuously extend over the outside surface and bottom surface of the substrate.

19. The surface acoustic wave device according to claim 11, wherein the surface acoustic wave element is grounded by the grounding electrode such that the grounding electrode absorbs an unwanted electromagnetic wave generated by the surface acoustic wave element.

20. The surface acoustic wave device according to claim 13, wherein the at least one frame body includes two layers defining an upper frame body and a lower frame body.

\* \* \* \* \*